US 6,617,675 B2

(12) United States Patent
Sakai et al.

(10) Patent No.: US 6,617,675 B2
(45) Date of Patent: Sep. 9, 2003

(54) SEMICONDUCTOR DEVICE AND SEMICONDUCTOR DEVICE ASSEMBLY

(75) Inventors: Tadahiko Sakai, Fukuoka (JP); Mitsuru Ozono, Fukuoka (JP); Shoji Sakemi, Fukuoka (JP); Yoshiyuki Wada, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/012,540

(22) Filed: Dec. 12, 2001

(65) Prior Publication Data
US 2002/0084470 A1 Jul. 4, 2002

(30) Foreign Application Priority Data
Dec. 15, 2000 (JP) ........................................ 2000-381890

(51) Int. Cl.[7] .............................................. H01L 23/02
(52) U.S. Cl. ........................ 257/678; 257/693; 438/25; 438/26; 438/51; 438/64; 438/106; 438/108
(58) Field of Search .......................... 257/678, 685–86, 257/693; 438/25–26, 51, 64, 106–108, 597, 618, 666, 677

(56) References Cited
U.S. PATENT DOCUMENTS

| | | | | |
|---|---|---|---|---|
| 4,021,766 A | * | 5/1977 | Aine .............................. | 338/2 |
| 5,311,059 A | * | 5/1994 | Banerji et al. ................ | 257/778 |
| 5,585,311 A | * | 12/1996 | Ko ................................. | 437/228 |
| 5,892,271 A | * | 4/1999 | Takeda et al. ................. | 257/668 |
| 5,897,336 A | * | 4/1999 | Brouillette et al. .......... | 438/108 |
| 5,925,930 A | * | 7/1999 | Farnworth et al. ........... | 257/737 |
| 5,956,575 A | * | 9/1999 | Bertin et al. .................. | 438/110 |
| 6,030,854 A | * | 2/2000 | Mashimoto et al. .......... | 438/106 |
| 6,228,680 B1 | * | 5/2001 | Thomas ......................... | 438/106 |
| 6,238,938 B1 | * | 5/2001 | Smith ............................ | 438/10 |
| 6,277,669 B1 | * | 8/2001 | Kung et al. ................... | 438/106 |
| 6,410,364 B1 | * | 6/2002 | Hashimoto .................... | 438/118 |

FOREIGN PATENT DOCUMENTS

JP  9-199631  * 7/1997 ........... H01L/23/12

OTHER PUBLICATIONS

Drexler et al. "Thermally induced deformations in a flip–chip HDI substrate" Electronic components and technology conference 2000 proceedings p. 650–656.*
Fujiuchi et al. "Collective screen printing for carrier bump and SMT pads" Electronic manufacturing technology Symposium 1995 18th IEEE/CPMT international Dec. 4–6, 1995 p. 109–112.*
E.S. Drexler, "Plastic strain in thermally cycled flip–chip PBGA solder bumps" IEEE transactions on advanced packaging vol. 23 No. 4, Nov. 4, 2000, p. 646–651.*

* cited by examiner

Primary Examiner—Matthew Smith
Assistant Examiner—Granvill D Lee, Jr.
(74) Attorney, Agent, or Firm—Wenderoth, Lind, & Ponack, L.L.P.

(57) ABSTRACT

A semiconductor device assembly and a semiconductor device are provided which both can ensure reliability after a mounting process. The semiconductor device includes a semiconductor element equipped with bumps on an electrode patterned surface thereof for external connection. In the semiconductor device mounted on a substrate in the semiconductor device assembly, a semiconductor element shaped to have a thickness ranging from 200 μm to 10 μm has reduced flexural rigidity so as to be easily deflected. In the status that the bumps are joined to corresponding circuitry electrodes on the substrate, the semiconductor element can deflect at other portions other than its surface between two adjacent bumps according to contraction and distortion of the substrate. This allows the bumps to be dislocated in a direction parallel to a surface of the semiconductor element, hence relieving stress developed by the contraction of the substrate at the joint positions between the bumps and the circuitry electrodes.

8 Claims, 6 Drawing Sheets

SEMICONDUCTOR DEVICE AND SEMICONDUCTOR DEVICE ASSEMBLY

FIELD OF THE INVENTION

The present invention relates to a semiconductor device having a semiconductor element equipped with an electrode on an electrode patterned surface for external connection, and to a semiconductor assembly including a work piece having the semiconductor device mounted thereon.

BACKGROUND OF THE INVENTION

As a semiconductor device assembly including a semiconductor device having a semiconductor element package, an assembly is known in which an electrode projection, e.g. a solder bump, provided on the semiconductor device are joined to a corresponding circuitry electrode of a work piece. In order to ensure reliability in the assembly after the mounting, it is necessary to reduce stress exerted on a joint at the electrode projection such as the solder bump.

In a conventional semiconductor assembly, stress is derived from a difference of respective thermal expansions between the semiconductor element and the work piece due to a change in an ambient temperature after the mounting, and the stress concentrates particularly on the joint. The thermal stress, which is repeatedly exerted at upon heat cycling, may injure the joint and thus impair the reliability after the mounting.

SUMMARY OF THE INVENTION

A semiconductor device and a semiconductor device assembly are provided and both ensure reliability after mounting.

The semiconductor device includes a semiconductor element having an electrode patterned surface and an external connection electrode provided on the electrode patterned surface. Under the situation where the external connection electrode is joined to a corresponding circuitry electrode on a work piece, the semiconductor element can deflect between two adjacent external connection electrodes according to a contraction displacement of the work piece.

DESCRIPTION OF THE PREFERRED EMBODIMENTS

Embodiment 1

Figure 1:
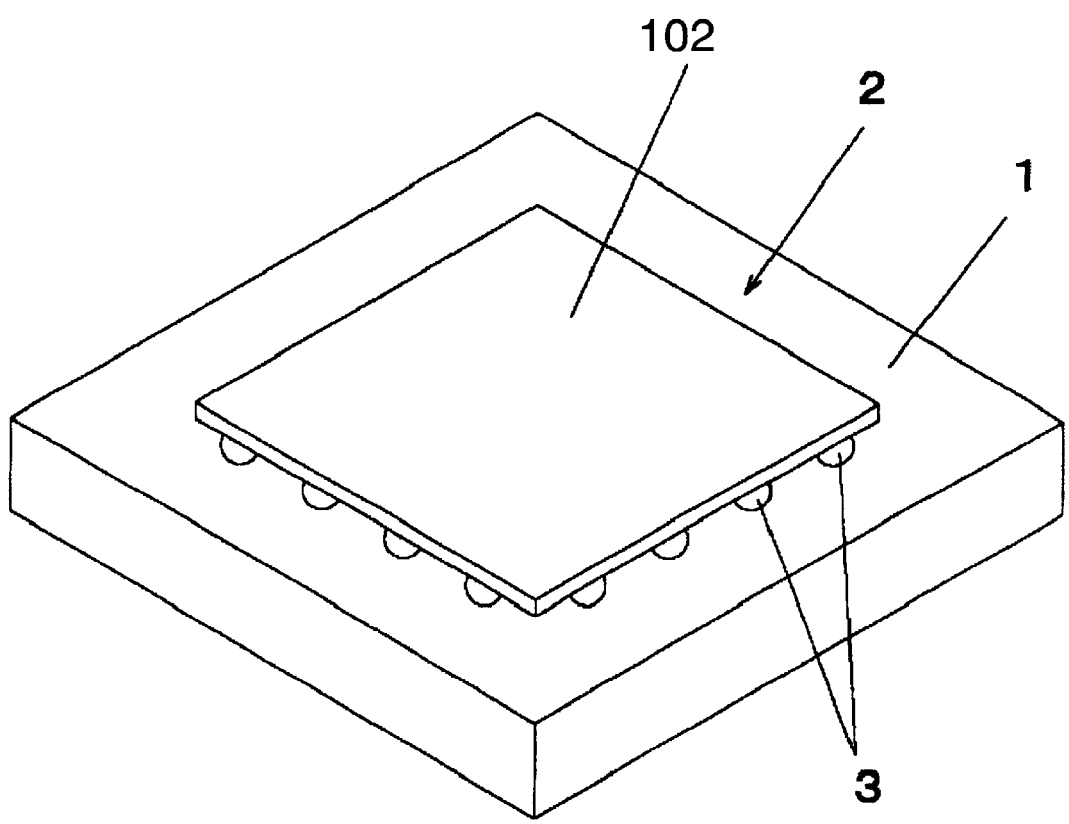
FIG. 1 is a perspective view of a semiconductor device assembly according to Embodiment 1 of the present invention.
Figure 2A:
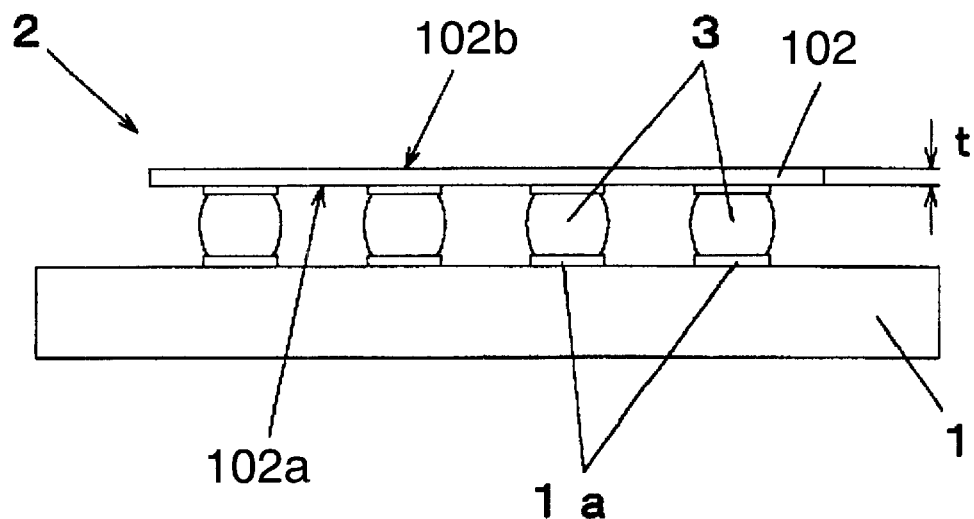
FIG. 2A and FIG. 2B are cross sectional side views of the semiconductor device assembly according to Embodiment 1.
Figure 2B:
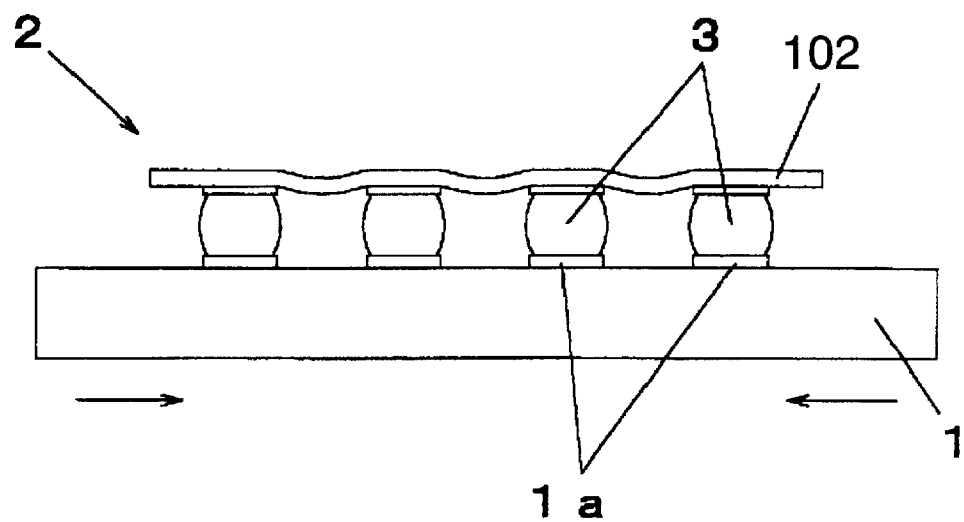
Figure 3:
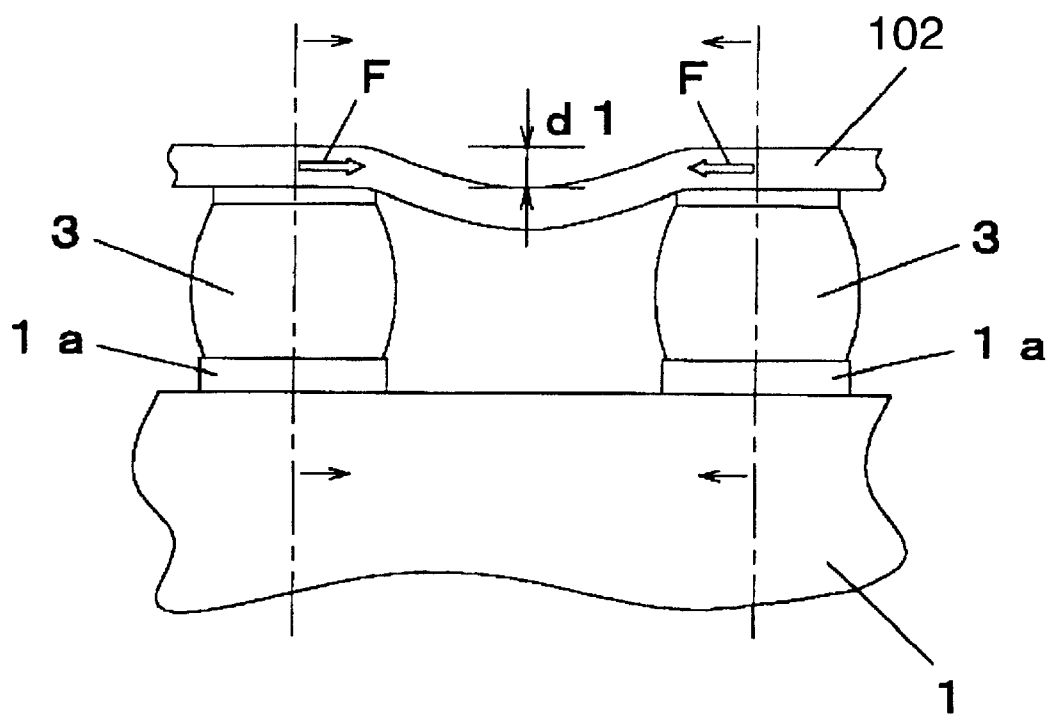
FIG. 3 is a partially cross sectional view of the semiconductor device assembly according to Embodiment 1.

FIG. 1 is a perspective view of a semiconductor device assembly according to Embodiment 1 of the present invention. FIGS. 2A and 2B are cross sectional side views of the assembly. FIG. 3 is a partially cross sectional view of the assembly.

As shown in FIG. 1, a semiconductor device 2 is mounted on a substrate 1 that constitutes a work piece. The semiconductor device 2 includes a semiconductor element 102 fabricated from a thin sheet of silicon. The lower surface (an electrode patterned surface) 102a of the semiconductor element 102 has metal bumps 3 provided thereon as electrodes for external connection. Upon having the bumps 3 joined by soldering to circuitry electrodes 1a of the substrate 1, the semiconductor device 2 is mounted to the substrate 1.

As shown in FIG. 2A, the semiconductor device 102 is subjected to a thinning process by machine-polishing or etching, and has a thickness t ranging from 200 $\mu$m to 10 $\mu$m. Generally, the thinner the semiconductor device 102 mounted through the bumps 3 to the substrate 1, the higher joining reliability thereof after the mounting process. For the sake, the semiconductor device 102 in the semiconductor device assembly of Embodiment 1 is thinned as described so that that the thickness t is in the range of 200 $\mu$m to 10 $\mu$m.

In the thinning process, the other side 102b opposite the electrode patterned side of the semiconductor device 102 is roughly machine-polished with a grinding stone, and is finished with dry etching or wet etching using an etching liquid. The machine-polishing may produce a damaged surface at the other side 102b having micro-cracks. The damaged surface, which reduces the anti-folding strength of the semiconductor device 102, can be eliminated by the finishing process, and the semiconductor device 102 accordingly has a strength against folding. Further, the semiconductor device, upon having the damaged surface eliminated therefrom, becomes flexible other than at its surface.

FIG. 2B illustrates the semiconductor device assembly including the substrate 1 and the semiconductor device 2 mounted thereon, with the semiconductor contracted and distorted by an external force produced at each heat cycle after the mounting. As described above, the semiconductor element 102 is thin and can easily be deflected. An external force developed by the contraction and deformation of the substrate 1 is transferred via the bumps 3 to the semiconductor element 102. Since the semiconductor element 102 receives compressing loads from the bumps 3, it deflects at portions other than its surface.

More specifically, as shown in FIG. 3, the thinned semiconductor element 102, when receiving compression loads F while being restrained from moving upward and downward at joint positions joined to the bumps 3, vertically deflects by a distance d1 between two adjacent bumps 3. The deflection can absorb most of the deformation in a horizontal direction in the substrate 1. As a result, this arrangement significantly relieves stress which is produced by a counter-force of the compression of the semiconductor element 102 and is applied to the bumps 3 or to the joint positions of the bumps 3 and the corresponding circuitry electrodes 1a of the substrate 1.

In other words, the bumps 3 provided on the semiconductor element 102 can be moved in certain (horizontal) directions in parallel with the surface of the semiconductor element 102 when the substrate 1 is contracted and distorted. This relieves the stress which is produced by the contraction of the substrate 1 and is exerted on the joints between the bumps 3 and the substrate 1. It can be confirmed experimentally that the semiconductor element 102 having a thickness t less than 200 $\mu$m is flexible enough to absorb influence of contraction and deformation of the substrate 1.

As described, the semiconductor element 102 is thinned enough to be deflected at other than its surface by the compression loads F to thus absorb the influence of the contraction and deformation of the substrate 1. Accordingly, the stress exerted on solder joints can be relieved without any reinforcement, e.g. an under-fill resin applied after the mounting process. Also, reliability of the assembly after the mounting process can be ensured even with the above simple package structure Embodiment 2

Figure 4:
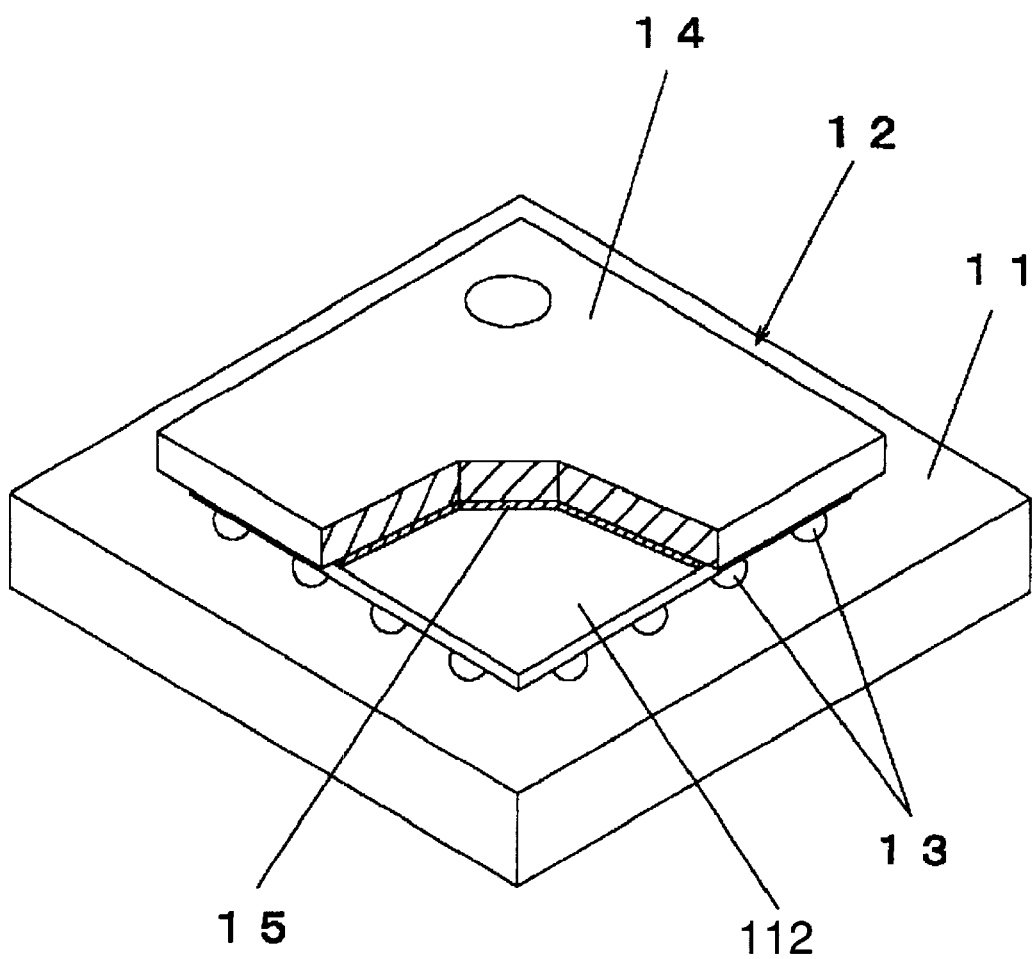
FIG. 4 is a perspective view of a semiconductor device assembly according to Embodiment 2 of the present invention.
Figure 5A:
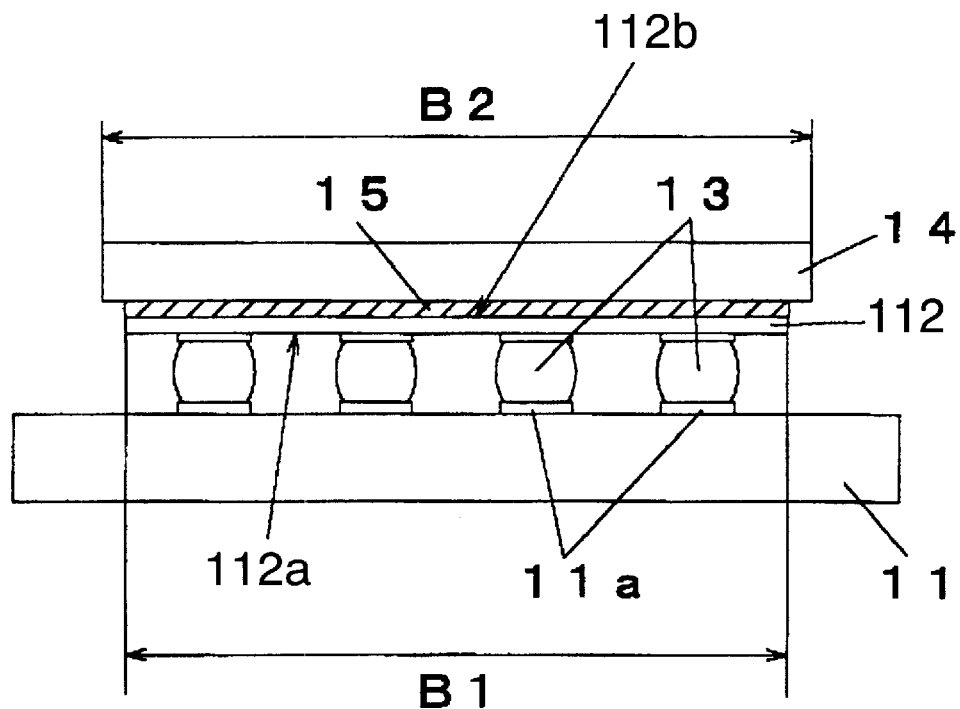
FIGS. 5A and 5B are cross sectional side views of the semiconductor device assembly according to Embodiment 2.
Figure 5B:
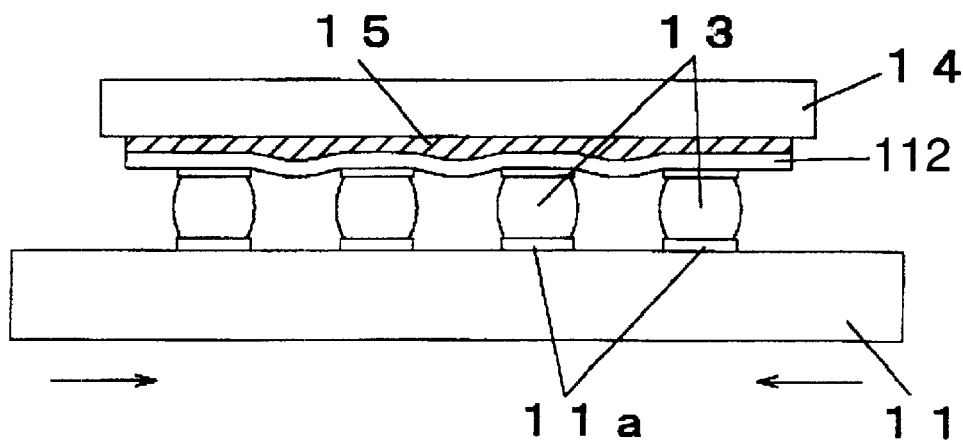
Figure 6:
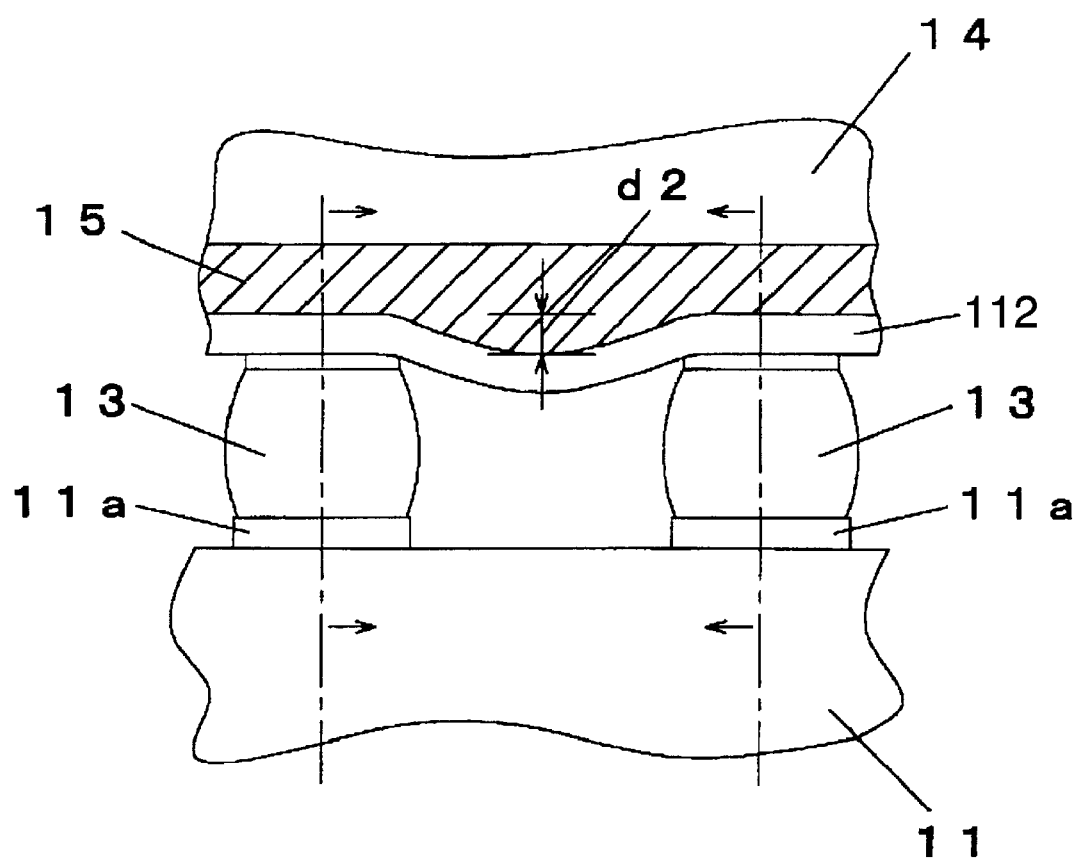
FIG. 6 is a partially cross sectional view of the semiconductor device assembly according to Embodiment 2.

FIG. 4 is a perspective view of a semiconductor device assembly according to Embodiment 2 of the present invention. FIG. 5A and FIG. 5B are cross sectional side views of the assembly. FIG. 6 is a partially cross sectional view of the assembly.

In FIG. 4, a semiconductor device 12 is mounted on a substrate 11. The semiconductor device 12 includes a semiconductor element 112, which is identical to the semiconductor element 102 of Embodiment 1. The semiconductor element 112 has an electrode patterned surface 112a at a lower side thereof on which bumps 13 are provided as electrodes for external connection. The semiconductor device 21, upon having bumps 13 joined by soldering to circuitry electrodes 11a of the substrate 11, is mounted to the substrate 11.

As shown in FIG. 5A, a bumper 14 as a reinforcing member is bonded, with an adhesive 15, to the other side 112b opposite the electrode patterned side 112a of the semiconductor element 112 in the semiconductor device 12. The size B2 of the bumper 14 is greater than the size B1 of the semiconductor element 112, and the bumper has an outer edge extending outwardly beyond that of the semiconductor element 112. Accordingly, the semiconductor element 112 can be protected at its sides by the bumper 14 when the semiconductor device 12 is handled. The bumper 14 is bonded to the semiconductor element 112 by an adhesive 15. The adhesive 15 is a low elasticity resin adhesive, e.g. an elastomer which has a low elastic modulus, and can easily be contracted or expanded by a small external force. The elastic modulus is smaller than that of the semiconductor element.

FIG. 5B illustrates the semiconductor device assembly where the substrate 11 including the semiconductor device 12 mounted thereon is contracted and distorted by an external force produced at each heat cycle after the mounting process. Similar to Embodiment 1, the semiconductor element 112 is thin and can easily be deflected. An external force developed by the contraction and deformation of the substrate 11 is transferred via the bumps 13 to the semiconductor element 112. Compressing loads from the bumps 13 deflect the semiconductor element 112 at portions other than its surface.

More specifically, as shown in FIG. 6, the thinned semiconductor element 112, when receiving compression loads F while being restrained against moving upward and downward at the joint positions joined to the bumps 13, vertically deflects by a distance d2 between two adjacent bumps 13. While the semiconductor element 112 remains bonded with the adhesive 15, the adhesive 15 can easily be contracted or expanded by a small external force. Accordingly, the semiconductor element 112 can easily deform, and thus, the assembly has almost the same stress relieving advantage as that of Embodiment 1. The semiconductor device assembly of Embodiment 2 hence has an equal advantageous effect to that of Embodiment 1.

Although the reliability after the mounting process according to both Embodiments 1 and 2 remains at almost the same level without an under-fill resin, which is essential in the prior art, the resin can improve the reliability upon being combined with the technique in Embodiments 1 and 2.

What is claimed is:

1. A semiconductor device comprising:

a semiconductor element having an electrode patterned surface; and external connection electrodes provided on the electrode patterned surface, wherein, in case the external connection electrodes are joined to corresponding circuitry electrodes provided on a work piece, the semiconductor element can deflect between the external connection electrodes according to a displacement of a distortion of the work piece.

2. A semiconductor device according to claim 1, wherein a thickness of the semiconductor element ranges from 200 $\mu$m to 10 $\mu$m.

3. A semiconductor device according to claim 1, further comprising:

a bumper joined to the semiconductor element; and an adhesive for bonding the bumper to the semiconductor element.

4. A semiconductor device according to claim 3, wherein the adhesive has a smaller elastic modulus than the semiconductor element.

5. A semiconductor device assembly comprising:

a semiconductor device including a semiconductor element having an electrode patterned surface, and external connection electrodes provided on the electrode patterned surface; and a work piece having circuitry electrodes thereof connected to the external connection electrodes, wherein the semiconductor element can deflect between the external connection electrodes according to a displacement of a distortion of the work piece.

6. A semiconductor device assembly according to claim 5, wherein a thickness of the semiconductor element ranges from 200 $\mu$m to 10 $\mu$m.

7. A semiconductor device assembly according to claim 5, further comprising:

a bumper joined to the semiconductor element; and an adhesive for bonding the bumper to the semiconductor element.

8. A semiconductor device assembly according to claim 7, wherein the adhesive has a smaller elastic modulus than the semiconductor element.

* * * * *